United States Patent
Haghiri-Tehrani et al.

[11] Patent Number: 6,049,461
[45] Date of Patent: Apr. 11, 2000

[54] CIRCUIT UNIT AND A METHOD FOR PRODUCING A CIRCUIT UNIT

[75] Inventors: Yahya Haghiri-Tehrani; Ando Welling, both of Munich, Germany

[73] Assignee: Giesecke & Devrient GmbH, Munich, Germany

[21] Appl. No.: 08/686,026

[22] Filed: Jul. 25, 1996

[30] Foreign Application Priority Data

Jul. 26, 1995 [DE] Germany .......................... 195 27 359

[51] Int. Cl.[7] ............................. H05K 1/00; G06K 19/07
[52] U.S. Cl. ....................... 361/737; 361/736; 235/492; 343/895; 257/679
[58] Field of Search ................................... 361/737, 736; 235/492; 343/895; 257/679

[56] References Cited

U.S. PATENT DOCUMENTS 4,960,983  10/1990  Inoue .
4,999,742  3/1991   Stampfli ................................. 361/782

FOREIGN PATENT DOCUMENTS 54 75 63   4/1993   European Pat. Off. .
2 621 147  3/1931   France .
44 16 697  11/1995  Germany .
4 428 732  1/1996   Germany .
6-33 6096  12/1994  Japan .

Primary Examiner—Donald Sparks
Assistant Examiner—Jayprakash N. Gandhi
Attorney, Agent, or Firm—Bacon & Thomas, PLLC

[57] ABSTRACT

A circuit unit having an insulating substrate (1) on which a conductive, flat coil (3) is located. The coil (3) can consist of a plurality of coil layer sections (9, 17) separated by insulating layers (11). To interconnect the individual coil layer sections (9, 17) into a coil, at least one opening (13) is provided in each of the insulating layers (11). The connection between the first coil ends (15, 19) of the coil (3) and an integrated circuit (7) or a module (23) containing the integrated circuit (7) can be formed solely by the coil ends (15, 19) and the connection points (27) of the integrated circuit (7) or the contacts (25) of the module (23) touching. The individual turns of the coil (3) can be disposed and dimensioned so as to permit embossing of the circuit unit without restriction within an area (37, 38) conforming with the standard.

10 Claims, 4 Drawing Sheets

CIRCUIT UNIT AND A METHOD FOR PRODUCING A CIRCUIT UNIT

BACKGROUND OF THE INVENTION

1. Field of the Invention

This invention relates to a circuit unit comprising at least an insulating substrate on which a conductive coil is located, and an integrated circuit whose connection points are electrically connected with the coil ends. The invention relates further to a method for producing such a circuit unit.

2. Related Technology

Circuit units of the above type are known from the prior art, being designed for example as compact electronic modules which are inserted in chip cards for noncontacting data exchange with a terminal. For example U.S. Pat. No. 4,999,742 discloses a circuit unit in the form of an electronic module with an insulating substrate on which a ring-shaped wound coil is glued. The coil ends are guided into the receiving space arising through the ring-shaped coil, and electrically connected there with the connection points of an integrated circuit. The receiving space for the integrated circuit and coil ends is cast with a casting compound for protecting these sensitive components from mechanical loads.

The electronic module known from U.S. Pat. No. 4,999,742 has a compact structure but the coil must be wound in a separate method step and glued on the insulating substrate in a further method step.

However, the as yet unpublished German patent application P 44 16 697.4 discloses a circuit unit in the form of a chip card having printed on one card layer of the multilayer card body a coil from a conductive lacquer whose ends are electrically connected with the connection points of an integrated circuit.

The structure of the circuit unit known from patent application 44 16 697.4 has the advantage that the coil is printed directly on a card layer so that the method step of applying a separately manufactured coil to an insulating substrate is omitted. For some applications of the circuit unit, however, it is desirable for the coil to have a higher number of turns than can be realized with the structure explained above. Furthermore it may be desirable to provide the circuit unit with relief embossing. One must then make sure the printed turns of the coil, which are generally formed as a very thin layer, are not interrupted. Also, the production method for the circuit unit should be further optimized with regard to inexpensive mass production.

From U.S. Pat. No. 4,960,983 (Inoue) a circuit unit in the form of an IC card is known. The IC card comprises an electronic module with a coil structure being formed on the semiconductor substrate of the electronic module. A coil may be formed of two or more coil structures which are deposited on different metallic layers having insulation layers between the metallic layers whereat the metallic layers are interconnected by means of a central conductive member which extends between the distinct metallic layers.

However, the Inoue patent teaches forming the coil on the substrate of the IC chip. As the production of semiconductor devices is very expensive and the yield depends directly on the area of semiconductor covered by the IC chip, the teaching of Inoue has both the disadvantage of high cost and low yield as the area covered by the an IC comprising coil structure is enormous. The size of the IC chip has the further disadvantage of being susceptible to mechanical stress. The IC chip is embedded in the card body which is flexible therefore torsion or bend may destroy the IC card or the IC chip.

From JP 6 336096 a chip card is known which is produced from two insulating substrates. Each of the substrates has a coil pattern. After connecting the two substrates by an insulating adhesive the two coil patterns form one coil.

However, as it is stated expressly not to use a through hole for contacting the two coil patterns and as the coil patterns are formed on different substrates, chip cards having coil layers and insulating layers which are applied alternately to a substrate are discouraged.

From EP 0 547 563 B1 a printed circuit board antenna is known which has a plurality of different coil layers. However the European patent does not show the use of an IC chip. In particular this is a disadvantage because the two coil ends are on different sides of the circuit board. If an IC chip is to be mounted on one side of the circuit board an additional through hole is necessary to connect the IC to the second end of the coil. Additional connectors are also necessary to connect the different layers of the coil which is especially a disadvantage because an additional step is necessary to insert the connectors.

It is therefore the problem of the invention to further improve the abovementioned circuit unit and at the same time in particular to extend its range of applications. It is further the problem of the invention to propose a method for producing such a circuit unit.

BRIEF SUMMARY OF THE INVENTION

One advantage of the invention is to be seen in that a higher number of turns can be realized than on the structure known from German patent application 44 16 97.4. The coil can still be applied directly to the substrate of the circuit unit so that an additional method step for applying a separately manufactured coil is unnecessary. This is made possible by the fact that coil layers and insulating layers are applied alternately to the insulating substrate, the individual coil layers being electrically interconnected via plated-through holes so as to yield a coil. The coil layers and insulating layers are preferably printed on. Alternatively it is also possible for the insulating layers to consist of thin insulating foils on which the coil layers are printed on one or both sides. The throughplating through the insulating layers can be done in the simplest case by providing windows or holes in the insulating layers through which the conductive material of the coil layers penetrates when the coil layers are printed on or the layers laminated together. Additional conductive material can likewise be applied for throughplating, or additional conductive elements provided.

A further advantage of the invention is to be seen in that the circuit unit can be manufactured especially easily by the multiple-copy method, since one can apply the coil layers and also the insulating layers (depending on the embodiment) using printing technology, with which multiple-copy production is commonplace.

Furthermore the invention has the advantage that the coil ends can be adapted especially easily to the various possibilities of forming the electric connection between the coil ends and the connection points of the integrated circuit.

Furthermore it is advantageous that the invention permits relief embossing of the circuit unit without restriction, with no danger of one or more turns of the coil being interrupted. For this purpose the turns of the coil are guided outside the relief embossing area of the circuit unit or between the individual relief embossing lines, whereby the width of the turns can be greater than the line spacing for compensating production tolerances, or the turns run in the area of the embossed characters but are wider than the character size.

BRIEF DESCRIPTION OF THE DRAWINGS

Some embodiments and further advantages of the invention will be explained in connection with the following figures, in which:

FIGS. 6 to 10a–10b show embodiments for throughplating for forming an electric connection between opposite coil layers in cross section.

DETAILED DESCRIPTION OF PREFERRED EMBODIMENTS OF THE INVENTION

Figure 1:
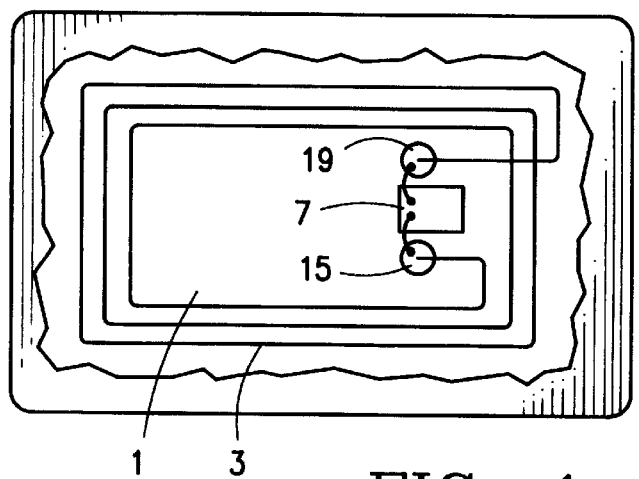
FIG. 1 shows a circuit unit in a plan view.

FIG. 1 shows systematically a circuit unit in the form of a chip card for noncontacting data exchange in a plan view. The dimensions of such chip cards are identical with the dimensions of chip cards for contacting data exchange, which are fixed in ISO standard 7810. The circuit unit contains insulating substrate 1 in the form of a card layer on which coil 3 is located whose free ends 15 and 19 are electrically connected with the connection points of integrated circuit 7. The integrated circuit can also be cast into a module which, for easier contacting of integrated circuit 7, has contact surfaces which are electrically connected with the connection points of integrated circuit 7. The turns of coil 3 run along the outer edge of the card layer, yielding a large-area coil in the interests of high energy input.

Figure 2:
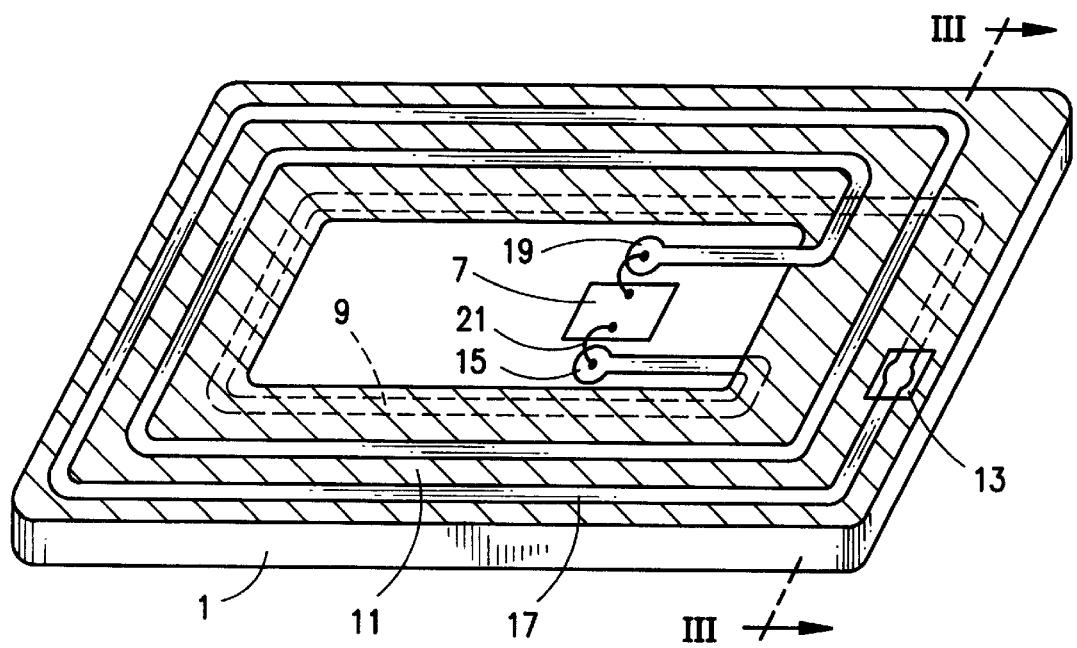
FIG. 2 shows a circuit unit in a perspective view.

FIG. 2 shows a perspective view not true to scale of an inventive circuit unit which is produced as described in the following. On insulating substrate 1, which exists e.g. in the form of a card layer (see FIG. 1) one first applies first coil layer section 9, which is dash-lined in FIG. 2 and can contain a plurality of turns (coil layer section 9 shown contains only one turn in order not to complicate the drawing). Coil layer section 9 is preferably printed on with a conductive lacquer, but it is also possible to spray on the coil layer using a corresponding mask, or to etch it out of a conductive coating located on the substrate. Other production techniques are conceivable.

After applying coil layer section 9 one applies to insulating substrate 1 insulating layer 11, which is hatched in FIG. 2 and covers the turns of coil layer section 9. Insulating layer 11 has window 13 and is applied to coil layer section 9 in such a way that first end 15 of coil layer section 9 is not covered thereby and at least the second end area of the last turn of coil layer section 9 is accessible through window 13. Insulating Layer 11 is preferably likewise printed on, but it is also possible here to spray it on using a corresponding mask or to use as insulating layer 11 a thin insulating foil, etc.

In a further method step one applies further coil layer section 17 to insulating layer 11 using the same techniques as for applying coil layer section 9. Further coil layer section 17 is preferably also printed on. Coil layer section 17 is electrically connected with coil layer 9 through window 13 in insulating layer 11, yielding coil 3 consisting of coil layer sections 9 and 17. One can facilitate the formation of an electric connection between coil layer sections 9 and 17 by making the coil ends which are electrically interconnected wider than the turns of the coil, as also shown in FIG. 2. It is easy to realize such widening by printing technology. Details on the connecting technique will be described below.

One can optionally repeat the application of further insulating layer sections and coil layers in the explained manner once or several times until circuit unit coil 3 composed of the coil layer sections has the desired number of turns. One must thereby make sure that first end 15 of the coil layer section first printed on (e.g. layer 9) is not covered, and that the circuit unit does not exceed a predetermined height. When printing on the last coil layer section (e.g. layer 17) one can overprint first end 15 of the first printed coil layer section with a conductive lacquer again. One then obtains two freshly printed first coil ends 15 and 19 of the coil layer section which can be electrically connected with the integrated circuit especially easily.

End 19 of the last applied coil layer section, i.e. coil layer section 17 in FIG. 2, is applied in such a way that it is especially easy to form an electric connection from first coil ends 15 and 19 to integrated circuit 7. In the embodiment of the invention shown in FIG. 2 the coil layer sections and insulating layers are applied to insulating substrate 1 in a kind of frame. In the shown embodiment, coil section ends 15 and 19 are guided into the interior of the frame onto insulating substrate 1. One avoids superimposition of turns in a coil layer section by guiding the internal first ends of the particular coil layers into the part enclosed by the frame, as shown in FIG. 2.

By suitable choice of the coil ends which are electrically connected with the integrated circuit one can always avoid superimposition of turns in a coil layer section. For example, if coil end 19 is to be outside the frame the internal or second end of coil layer section 17 is connected with second end of coil layer 9 (FIG. 3) and the external first end of coil layer 17 guided outward.

Alternatively it is also possible to apply an insulating layer section with a window to the last coil layer section, whose free first end is connected with the integrated circuit. Through the window the free coil end can then be guided over the coil layer section in any direction, since no short-circuit can occur between the turns of the coil because of the covering insulating layer.

According to the embodiment of FIG. 2 one applies integrated circuit 7 to the noncovered part of insulating substrate 1, electrically connecting the connection points of the circuit with first ends 15 and 19 of the resulting coil formed by electrically connected sections 9 and 17 e.g. by means of bonding wires 21. One can simplify the formation of the electric connections from integrated circuit 7 to coil ends 15 and 19 by making the coil ends wider than the individual turns of the coil. For this purpose one need only accordingly adapt the artwork or, if the coil layers sprayed on, the masks used. No separate method steps are thus necessary for producing widened coil ends.

Figure 3:
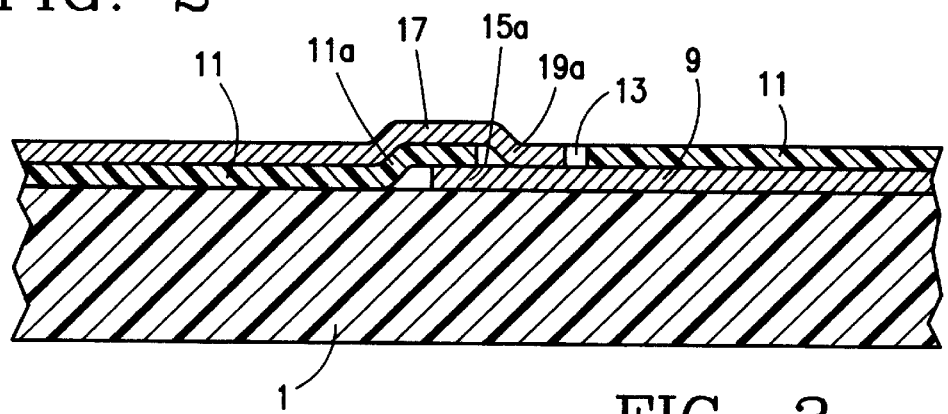
FIG. 3 shows a cross section along line III—III of FIG. 2.

FIG. 3 shows a cross section along line III—III of FIG. 2 to illustrate the sequence of layers. Coil layer section 9 is applied to insulating substrate 1, being covered by insulating layer 11 containing window 13 through which further coil layer section 17 is electrically connected with coil layer section 9. Layer 17 is located farther from the substrate 1 than layer 9. Second ends 15a and 19a of layers 9 and 17 overlap at the window 13 in insulating layer 11. A portion 11a of layer 11 overlaps second end 15a of layer 9. Further insulating layers and coil layers can follow alternately.

In a variant the connection between integrated circuit 7 and coil ends 15 and 19 is not formed via bonding wires but by directly mounting integrated circuit 7 on coil ends 15 and 19. For this purpose integrated circuit 7, or module 23 containing integrated circuit 7, can either be mounted on coil ends 15 and 19 already applied, or circuit 7 or module 23 is first inserted in substrate 1 and then overprinted with coil ends 15 and 19.

Figure 4A:
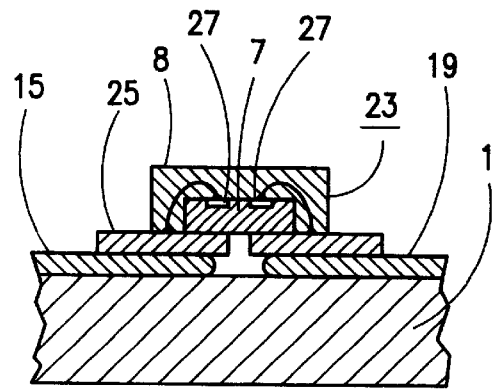
FIGS. 4a, 4b, 5a and 5b show embodiments for contacting a coil with an integrated circuit or module.
Figure 4B:
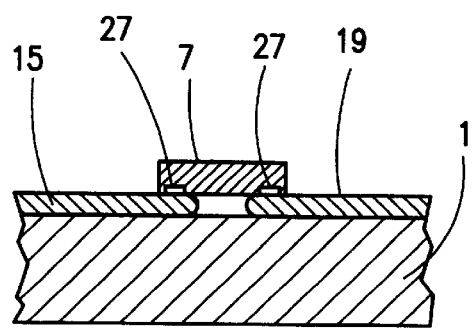

FIGS. 4A and 4B show cross sections of two embodiments of the inventive circuit unit wherein coil ends 15 and 19 were first printed on substrate 1, and module 23 or integrated circuit 7 then mounted on coil ends 15 and 19. Module 23 or integrated circuit 7 can be mounted either directly after the printing operation or only after a short period of time in which the printed conductive lacquer dries at least partly.

FIG. 4a shows substrate 1 with printed coil ends 15 and 19 and module 23. Module 23 contains integrated circuit 7 which is coated by casting compound 8 and whose connection points 27 are electrically connected with contacts 25 of module 23 via bonding wires. Module 23 is mounted on coil ends 15 and 19 in such a way that contacts 25 of module 23 touch coil ends 15, 19. The arrangement shown in FIG. 4a can be covered by a cover foil not shown in the figures, which optionally contains a gap for module 23. In the embodiment shown in FIG. 4a, module 23 is mounted on coil ends 15 and 19 in such a way that casting compound 8 points away from coil ends 15 and 19. However it is also possible to mount the module turned by 180°. In this case one should provide a corresponding gap in substrate 1 for partly receiving casting compound 8. This variant is used in particular when a low overall height of the circuit unit is to be achieved.

FIG. 4b again shows substrate 1 with printed coil ends 15 and 19. Integrated circuit 7 is mounted on coil ends 15 and 19 in such a way that connection points 27 of integrated circuit 7 touch coil ends 15, 19. As in the embodiment of FIG. 4a, the structure shown in FIG. 4b can also be protected by a cover foil not shown, which can optionally contain a gap for integrated circuit 7.

Figure 5A:
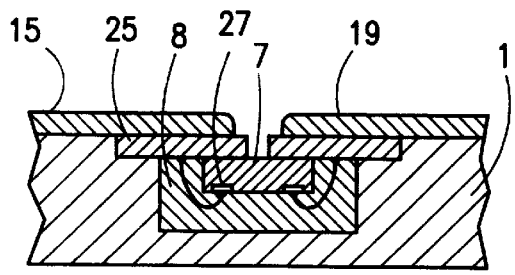
Figure 5B:
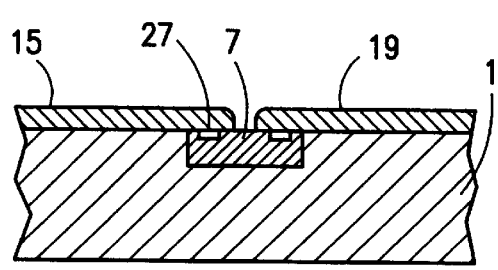

FIGS. 5A and 5B show cross sections of two embodiments of the inventive circuit unit whereby module 23 or integrated circuit 7 is overprinted for contacting with coil ends 15 and 19.

In FIG. 5a module 23 is fit into substrate 1 in such a way that the surface of module 23 is flush with the surface of substrate 1. Coil ends 15 and 19 printed on after insertion of module 23 in substrate 1 extend over the surface of module 23 so far that they partly cover contacts 25 of module 23 so as to form an electric connection between contacts 25 and coil ends 15 and 19.

In FIG. 5b integrated circuit 7, instead of module 23, is inserted into substrate 1 in such a way that the surface of integrated circuit 7 is flush with the surface of substrate 1 and connection points 27 of integrated circuit 7 point upward. Coil ends 15 and 19 are printed on substrate 1 in such a way that they extend over connection points 27 of integrated circuit 7. This forms an electric connection between connection points 27 and each coil end 15 and 19. For embedding integrated circuit 7 in substrate 1 one can either provide a corresponding gap, or press the chip into substrate 1 using heat and pressure.

Some variants for throughplating will now be described with which one can form electric connections between two coil layers or between a coil layer and connection point 27 of integrated circuit 7 or contact 25 of module 23 through insulating layer 11, for example a thin insulating foil.

Figure 6:
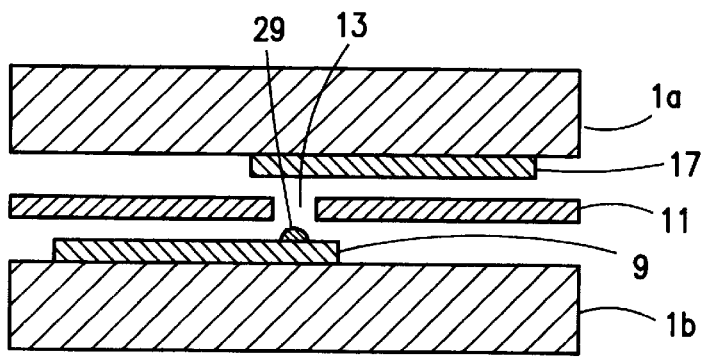

FIG. 6 shows an embodiment of the inventive circuit unit in cross section, in which the throughplating takes place when the individual layers of the circuit unit are laminated together. One can see the sequence of layers of the circuit unit before the laminating process.

According to FIG. 6 substrate 1a with coil layer section 17 and substrate 1b with coil layer section 9 are separated from each other by insulating foil 11. Window 13 is provided in foil 11 by punching, piercing or by laser beam at a place where coil layer sections 9 and 17 are opposite each other. Lamination produces a composite from individual layers 1a, 1b and 11. Simultaneously the laminating process forms an electric connection between coil layer section 9 and coil layer section 17 through window 13. This can be supported by applying to at least one of coil layer sections 9 and 17 opposite window 13 a small portion of conductive adhesive 29 which flows into window 13 during lamination, thereby forming an electric connection between coil layer sections 9 and 17.

Figure 7:
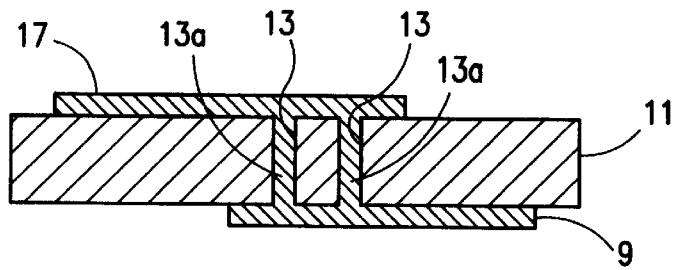

FIG. 7 shows an embodiment of the inventive circuit unit in cross section, in which insulating foil 11 is printed with coil layer sections 9, 17 one on each side, with layer sections 9 and 17 partly overlapping. In the overlap area insulating foil 11 has one or more windows 13 which are produced for example by punching, piercing or by laser beam. When coil sections 9 and 17 are printed on insulating foil 11 by the screen printing method, windows 13 are filled with the printing material, for example a conductive lacquer, thereby forming electric connections between ends of coil sections 9 and 17.

Figure 8:
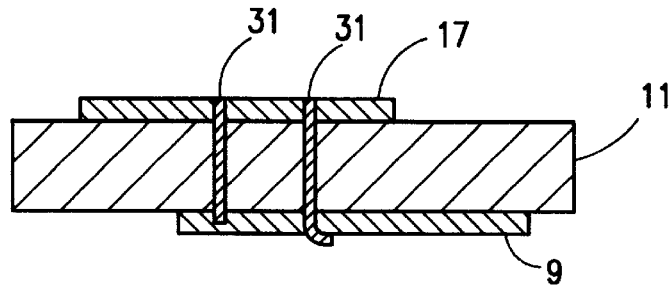

FIG. 8 shows a further embodiment for throughplating. As in FIG. 7 ends of coil section 9 and 17 are applied to the opposite sides of insulating foil 11 so that they partly overlap. In the overlap area at least one thin wire 31 is slipped in to penetrate the end of coil layer section 17, insulating foil 11 and at least partly also the end of coil layer section 9, thereby forming an electric connection between coil sections 9 and 17. Wire 31 can also be fed completely through coil layer section 9 and bent at its end by a suitable apparatus. To facilitate the feedthrough of wire 31 one can heat it in one variant of the embodiment.

Figure 9:
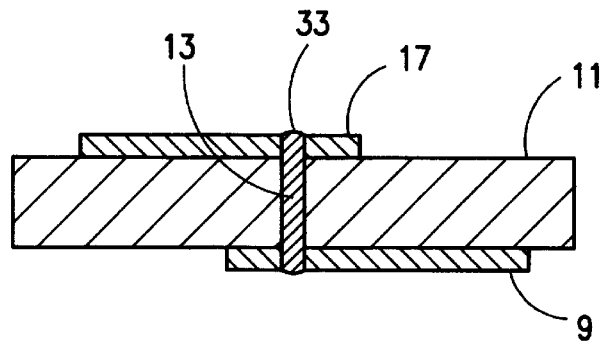

FIG. 9 shows an embodiment in which coil layer sections 9 and 17 are first applied to the opposite sides of insulating foil 11. At least one window 13 is then provided in coil layer sections 9 and 17 and intermediate insulating foil 11, for example by punching, piercing or by laser beam, in the area where opposite end of coil layer sections 9 and 17 overlap. Window 13 is finally filled with conductive adhesive 33 and an electric connection thus formed between coil layer sections 9 and 17.

Figure 10A:
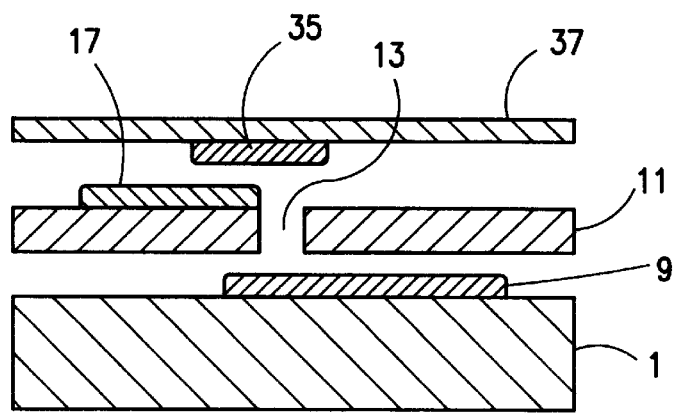
Figure 10B:
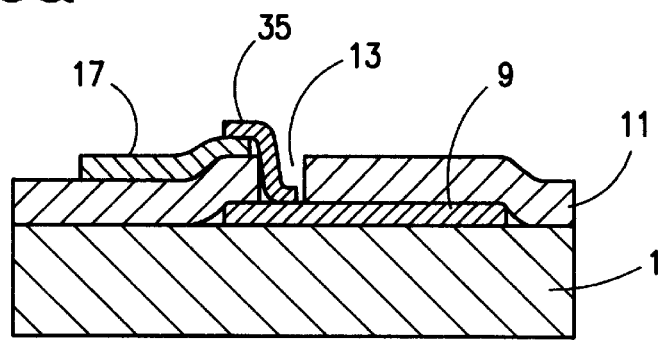

FIGS. 10A and 10B shows an embodiment in which an electric connection can be formed between ends of coil layer sections 9 and 17 by means of connecting element 35.

FIG. 10a shows the sequence of layers of the circuit unit before the laminating process. Coil layer section 9 is applied to substrate 1. Above substrate 1 there is insulating foil 11 which carries coil layer section 17 and has window 13 in an area opposite coil layer section 9 and adjacent coil layer section 17. Connecting element 35 is disposed on auxiliary carrier foil 37 above window 13 and overlapping with coil layer section 17. Connecting element 35 can consist for example of a thermally activable conductive adhesive.

FIG. 10b shows the layer structure from FIG. 10a after lamination. The layers shown in FIG. 10a can be joined into a compound under pressure and heat by means of a conventional laminating press. The laminating press die pressing against the top of the structure is formed so that connecting element 35 is pressed through window 13 against coil layer section 9 and connects therewith during the laminating process. The other end of connecting element 35 is pressed against coil layer section 17 and connects therewith. This forms an electric connection between coil layer sections 9 and 17. Auxiliary carrier foil 37 comes off connecting element 35 during lamination and is then removed.

In a variant of the invention one can omit window or windows 13 in insulating layer 11. In this variant there is no electric connection between the individual coil layer sections. The coil sections are instead coupled capacitively. Capacitive coupling can also be used for coupling integrated circuit 7 with coil 3 so that an electric connection can likewise be omitted here.

A further aspect of the invention is that it eliminates restrictions that existed up to now with respect to relief-embossing a circuit unit containing coil 3. This can be done by various measures each applicable with both single-layer and multilayer coils 3.

Figure 11:
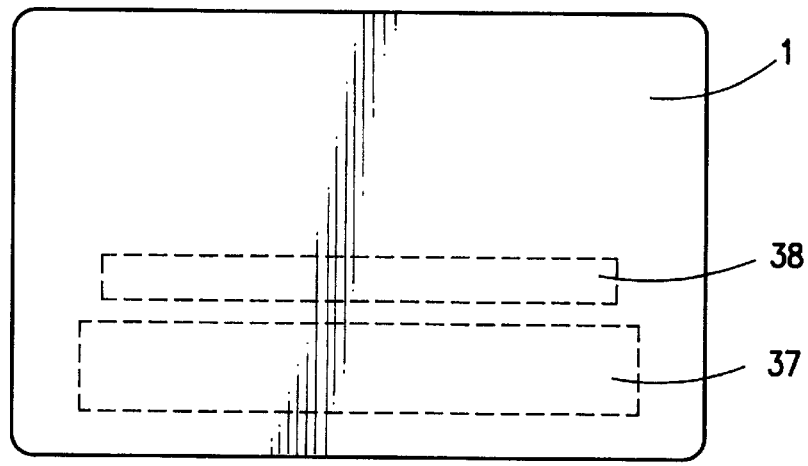
FIG. 11 shows a circuit unit with marked relief embossing fields in a plan view.

FIG. 11 shows a circuit unit in a plan view, with dotted lines delimiting areas 37 and 38 within which relief embossing is admissible in chip cards according to ISO standard 7811. Relief embossing can be used for example to bring out letters and numbers or other characters. The embossed characters can be printed on a paper voucher with a suitable apparatus if required. However, embossing can damage coil 3. Lower area 37 is especially problematic in terms of possible damage to turns of the coil, since coil 3 is generally required to have a large area and the turns therefore run close to the edge of the circuit unit.

Figure 12:
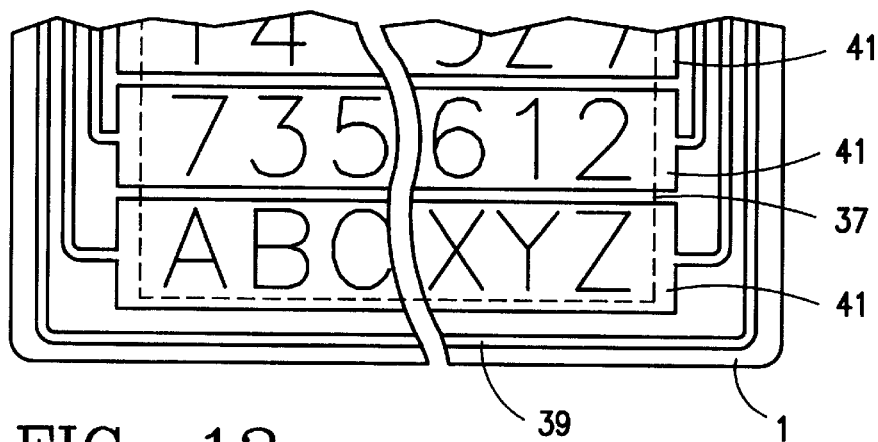
FIGS. 12, 13 show embodiments for forming and arranging turns of a coil as an enlarged detail in a plan view.

FIG. 12 shows an enlarged detail of the circuit unit shown in FIG. 11 in a plan view. To prevent interruption of the turns of coil 3, turn 39 is disposed between relief embossing field 37 and the edge of substrate 1 in the embodiment according to FIG. 3. If there is enough room, several turns or even all turns of coil 3 can also run here. Since no embossing occurs in this area there is no danger of the turns of coil 3 being interrupted by the embossing process. With a multilayer coil the room becomes scarce at higher numbers of turns than with a single-layer coil, since not all turns have to be disposed side by side.

Turns 41 running in the area of relief embossing field 37 are so greatly widened that they are wider than the size of the characters embossed there. This ensures that turns 41 are not interrupted by the embossing process, even if the embossed characters would each sever a cross section of turns 41 corresponding to the character size. If there is not enough room for one or more turns 39 outside relief embossing field 37, all turns 41 can be guided through relief embossing field 37.

Figure 13:
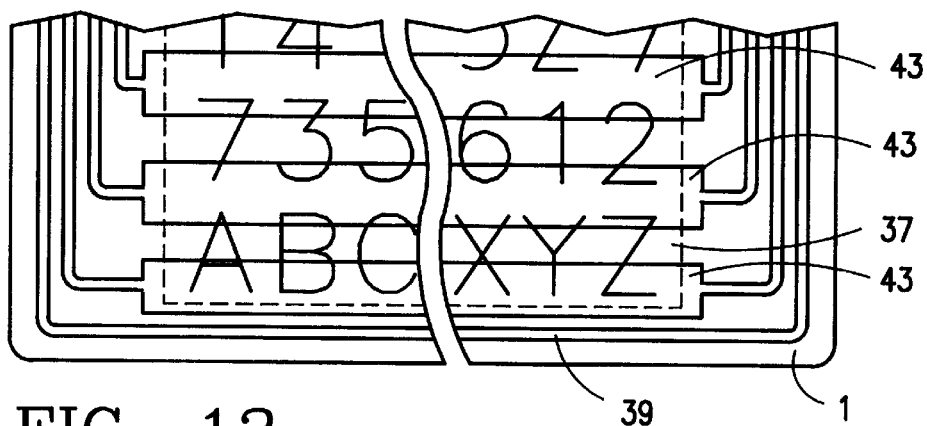

FIG. 13 likewise shows an enlarged detail of the circuit unit shown in FIG. 11 in a plan view. According to the embodiment shown in FIG. 13 the turns of coil 3 are guided either between relief embossing field 37 and the edge of the circuit unit (turn 39), or following the relief embossing lines or between the individual relief embossing lines (turns 43). Turns 43 running between the relief embossing lines or directly following the relief embossing lines are somewhat widened to compensate production tolerances. This ensures that at least a partial area of turns 43 runs on a surface which is not embossed so that there is no danger of turns 43 being interrupted. In the embodiment shown in FIG. 13 it also depends on the exact dimension of the turns whether no turn at all, or at least one turn 39, can be guided past the relief embossing field, i.e. whether there is enough room for one or even for several turns 39 between relief embossing field 37 and the edge of the substrate. The turn variants shown in FIGS. 12 and 13 can also be combined.

Besides the already outlined measures, others are also conceivable for preventing interruption of the turns of coil 3 by embossing. For example the properties of the coating material used for producing the turns can be adapted as greatly as possible to substrate 1 to which they are applied, so that the coating material does not crack and thus interrupt the turns during embossing. It is likewise conceivable to use as a coating material conductive plastics which are so elastic that they do not crack during embossing.

In the embodiments in which one or more turns 39 are guided between relief embossing field 37 and the edge of the circuit unit, the resistance of coil 3 might possibly assume inadmissibly high values since turns 39 must be very narrow due to the little room available. This problem can be counteracted by applying turns 39 in greater layer thicknesses, which can be done for example by multiple printing. It is likewise possible to reduce the resistance by widening turns 39 in the areas where enough room is available.

The circuit unit can be produced either in single piece production or via sheets or webs which are divided into individual circuit units at the end of production.

The described measures for improving the circuit unit, for example providing a multilayer coil structure whereby different throughplating variants are possible, permitting relief embossing of the circuit unit by suitably selecting the coil layer dimensions and pattern, optionally also material, and directly contacting the integrated circuit or module with the coil, can be used either singly or in combination.

We claim:

1. A chip card comprising:

a card body including an insulating carrier substrate (1);

at least one flat conductive coil (9,17) disposed on the substrate, the coil including first contact ends (15,19);

an integrated circuit (7) having terminals (27) coupled to the coil first contact ends in a manner permitting electrical signals to be transmitted between the at least one coil and the integrated circuit;

at least one electrically insulating layer (11) disposed on said insulating carrier substrate, said insulating layer including at least one through opening (13);

said coil disposed on said substrate in at least two sections (9,17) that are displaced respectively closer and farther away from the substrate, with each section extending generally parallel with the insulating layer, each section including one of said first contact ends (15,19) and a second end (15a,19a);

said at least one insulating layer extending between at least a portion of said coil sections with an electrical connection between coil sections extending through said at least one opening and said at least one insulating layer;

said electrical connection comprising said second coils ends (15a, 19a) of said coil sections joined together through said opening, with the second end (19a) of the coil section (11) located farther away from the carrier substrate extending through the opening and engaging the second end (15a) of the coil section (9) located closer to the substrate.

2. A chip card according to claim 1, wherein a terminal portion of the second end (15a) of said coil section (9) closer to the substrate is covered by a portion (11a) of said insulating layer.

3. A chip card according to claim 1, wherein the coil (3) consists of conductive plastic.

4. A chip card according to claim 1, wherein at least one of the coil sections (9,17) is printed on one of the substrate and insulating layer.

5. A chip card according to claim 1, wherein at least one of the coil sections (9) is printed on the substrate.

6. A chip card according to claim 1, wherein said insulating layer (11) has been printed on the substrate.

7. A chip card according to claim 1, wherein said insulating layer (11) has been sprayed onto said substrate.

8. A chip card according to claim 1, wherein at least said second ends (15a,19a) of said coil sections are dimensionally wider than the main body of the coil sections to facilitate their electrical interconnection.

9. A chip card according to claim 1, wherein said first ends (15,19) of said coil sections are connected to the integrated circuit terminals by a connection selected from the group consisting of mounting of the terminals directly on the coil section first ends, connecting the first ends to the integrated circuit via contacts and connecting the integrated circuit terminals to the coil section first ends by capacitative coupling.

10. A chip card comprising:

a card body including an insulating carrier substrate (1);

at least one flat conductive coil (3) disposed on the substrate, the coil including first contact ends (15,19);

an integrated circuit (7) having terminals (27) coupled to the coil first contact ends in a manner permitting electrical signals to be transmitted between the at least one coil and the integrated circuit;

at least one electrically insulating layer (11) disposed on said insulating carrier substrate;

said coil disposed on said substrate in at least two sections (9,17) that are displaced respectively closer and farther away from the substrate, with each section extending generally parallel with the insulating layer, each section including one of said first contact ends (15,19);

said at least one insulating layer extending between said coil sections;

an electrical connection between the coil sections comprising a capacitative coupling between said coil sections to form said at least one coil.

* * * * *